United States Patent [19]

Leidich

[11] 4,185,212

[45] Jan. 22, 1980

[54] LEVEL SHIFTING CIRCUIT

[75] Inventor: Arthur J. Leidich, Flemington, N.J.

[73] Assignee: RCA Corporation, New York, N.Y.

[21] Appl. No.: 892,515

[22] Filed: Apr. 3, 1978

[30] Foreign Application Priority Data

May 23, 1977 [GB] United Kingdom ............... 21687/77

[51] Int. Cl.$^2$ ............................................ H03K 17/00
[52] U.S. Cl. ................................... 307/362; 307/255; 307/296 R; 307/264
[58] Field of Search .................... 307/296 R, 297, 362, 307/255, 264; 330/261, 296; 357/92

[56] References Cited

U.S. PATENT DOCUMENTS

| | | | |
|---|---|---|---|
| 3,636,384 | 1/1972 | Dewitt | 307/297 |
| 4,027,177 | 5/1977 | Davis | 307/362 |

*Primary Examiner*—Stanley D. Miller, Jr.
*Assistant Examiner*—B. P. Davies

*Attorney, Agent, or Firm*—P. J. Rasmussen; A. L. Limberg; A. J. Jacobson

[57] ABSTRACT

A voltage comparator comprising first and second transistors of a first conductivity type receiving a current at an interconnection of their emitter electrodes has the collector of the first transistor connected to the base of a third transistor of a second conductivity type complementary to the first. Reference and bias potentials are applied respectively to the emitter of the third transistor and to the base of the second transistor; and input signal voltages to be compared to the bias potential are applied to the base of the first transistor. Input voltage swings to the reference potential are prevented from depriving the first transistor of sufficient collector potential to support flow of current from its collector to the base of the third transistor. This is done by inserting resistance between the source of input voltage and the base of the first transistor.

1 Claim, 1 Drawing Figure

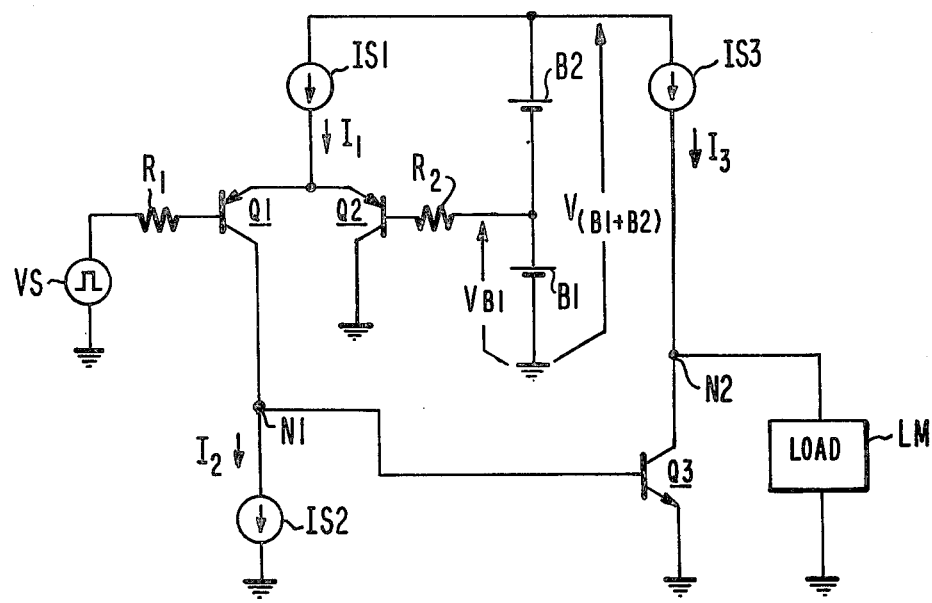

LEVEL SHIFTING CIRCUIT

The present invention relates to level-shifting circuitry.

Such circuitry may find use in buffering either transistor-transistor-logic ($T^2L$) or complementary metal-oxide-semiconductor (CMOS) logic circuitry from ensuing current injection logic ($I^2L$) circuitry. Such circuitry may also find use in the input stage of special purpose operational amplifier circuitry.

The present invention is embodied in level shifting circuitry of the following sort. A voltage comparator comprising first and second transistors of a first conductivity type receiving a current at an inter-connection of their emitter electrodes has the collector of the first transistor connected to the base of a third transistor of a second conductivity type complementary to the first. Reference and bias potentials are applied respectively to the emitter of the third transistor and to the base of the second transistor; and input signal voltages to be compared to the bias potential are applied to the base of the first transistor. Input voltage swings to the reference potential are prevented from depriving the first transistor of sufficient collector potential to support flow of current from its collector to the base of the third transistor. This is done by inserting resistance between the source of input voltage and the base of the first transistor.

The sole FIGURE of the drawing shows a level shifting circuit embodying the present invention.

PNP transistors Q1 and Q2 function to compare (a) the voltage applied to the base of Q1 from a source VS of input signal voltage and (b) the bias potential applied to the base of Q2 by a source B1 of direct voltage $V_{B1}$. The source VS of input voltage may be the output circuit of a $T^2L$ or of a CMOS logic circuit, for example. A current source IS1 applies a current $I_1$ to the interconnection of the emitters of Q1 and Q2. A current source IS2 seeks to remove a current $I_2$ from a node N1 to which the collector of Q1 and the base of Q3 connect. Absent collector current from Q1 in excess of $I_2$, current source IS2 keeps the base of Q3 "pulled down" to keep Q3 non-conductive. Current source IS3 supplies a current $I_3$ to node N2 at the collector of Q3, which current $I_3$ flows to load means LM when Q3 is non-conductive.

If the input signal voltage is sufficiently more positive than $V_{B1}$, Q1 is non-conductive and Q2 is conductive to divert $I_1$ to itself as emitter current. A substantial portion of this emitter current flows as collector current from Q2, which collector current may be applied to reference potential (ground), as shown, or may alternatively be applied to the base of a transistor to gate it into conduction.

If the input signal is sufficiently less positive than $V_{B1}$, Q2 is non-conductive and Q1 is conductive to divert $I_1$ to itself as emitter current. A substantial portion of this emitter current flows as collector current from Q1. The excess of this collector current over $I_2$ is applied to the base of NPN transistor Q3 to bias it from non-conduction into conduction. Q3 then diverts the current $I_3$ supplied node N2 from current source IS3 to its collector-to-emitter path, rather than permitting it to flow to load means LM. The current source IS3 may be the current injector of an $I^2L$ gate, for example, with load means LM being a multi-collector grounded-emitter transistor having its base connected to node N2.

The series connection of sources B1 and B2 supplies a sufficiently large positive operating potential $V_{(B1+B2)}$ to accomodate operation of current sources IS1 and IS3 and provides a return path for currents to these sources. IS1, IS2 and IS3 may consist simply of respective resistive elements, for example; or I1, I2 and I3 may be provided by the collector circuits of PNP, NPN and PNP transistors, respectively, as a further example.

Of particular interest to the present invention is the resistive element R1 used for connecting the source VS of input voltage to the base of Q1. If R1 were replaced by direct connection, when the input voltage swung to ground, the back-to-back connection of the collector-base junction of Q1 and emitter-base junction of Q3 would have zero volts across it, so current could not flow through the back-to-back connection. The common-emitter forward current gain $h_{feQ1}$ of Q1 would fall substantially to zero and the current $I_2$ would flow substantially in its entirety through the emitter-to-base path of Q1 and out of the base of Q1. Q1 would not supply sufficient collector current to exceed the current demanded by current source IS2, so Q3 would not be biased into conduction.

However, R1 is made of sufficiently high resistance that when the input voltage swings to ground, that portion of $I_1$ that flows as the base current of Q1 causes a large enough 1R drop across the resistance of R1 that Q1 still exhibits transistor action. That is, Q1 still exhibits an $h_{feQ1}$ sufficiently large to supply the rest of $I_1$ as its collector current at high enough level to exceed $I_2$, and so supply base current to Q3 to bias it into conduction, as desired.

Resistive element R2 may be replaced in less critical applications by a direct connection without intervening impedance. In more critical applications where it is desired to switch Q3 into conduction precisely whenever the input voltage swings less positive than $V_{B1}$, resistive element R2 will be made of equal resistance to resistive element R1, and current sources IS1 and IS2 will be made so that currents $I_1$ and $I_2$ are essentially in 2:1 ratio.

The level shifting circuitry of the present invention is readily integrable in monolithic form, on a substrate of p-type semiconductor material, Q1 and Q2 being lateral-structure transistors disposed in respective tubs of n-type semiconductor material that provides their respective base regions, and Q3 being a vertical structure transistor disposed in a tub of n-type semi-conductor material that provides its collector region, in accordance with conventional practice. R1 can then be integrated in a minimum die area by doping a portion of the n-type semiconductor material in the tub serving as the base region for Q1 with p-type impurities to form the body of R1 and to junction-isolate it from the base region of Q1. R2 can be similarly integrated within the tub of n-type semiconductor material providing the base region for Q2.

What I claim is:
1. In combination:
 a first terminal for receiving a reference potential;
 a second terminal for receiving a bias potential;
 a third terminal for receiving an input signal swinging over a range bounded by a voltage substantially equal to said reference potential and a voltage remote from said reference potential in the same sense said bias potential is, but in a larger amount;

first and second transistors of a first conductivity type and a third transistor of a second conductivity type opposite to said first conductivity type, each of said transistors having respective base and emitter and collector electrodes and having respective emitter-base and collector-base junctions, the collector and base electrodes of said second transistor having respective connections to said first terminal and to said second terminal, with said first conductivity type being such these connections reverse-bias the collector-base junction of said second transistor, the collector electrode of said first transistor being connected to the base electrode of said third transistor, and the emitter electrode of said third transistor being connected to said first terminal;

first current source means supplying current to an interconnection between the emitter electrodes of said first and second transistors, which current is of a polarity for forward-biasing at least one of their emitter-base junctions;

second current source means supplying a current of like polarity to a node at the collector electrode of said third transistor;

resistive means connecting said third terminal to the base electrode of said first transistor and having a sufficiently large resistance that when said input signal swings to said voltage substantially equal to said reference potential, that portion of the current from said first current source means flowing through the emitter-base junction of said first transistor and said resistive means causes a sufficiently large potential drop across said resistive means that transistor action is maintained in said first transistor, permitting a substantial remaining portion of the current from said first current source means to flow through the emitter-base junction of said third transistor, thereby placing said third transistor in conduction to conduct, as collector current, the current applied from said second source means away from the node at its collector electrode; and load means connected to the node at the collector electrode of said third transistor for conducting away such of the current from said second current source means as does not flow as collector current through the collector electrode of said third transistor.

* * * * *